(12) United States Patent  (10) Patent No.: US 7,525,187 B2
Speckels et al.  (45) Date of Patent: Apr. 28, 2009

(54) APPARATUS AND METHOD FOR CONNECTING COMPONENTS

(75) Inventors: Roland Speckels, Kamen (DE); Alfred Kemper, Warstein (DE)

(73) Assignee: Infineon Technologies AG, Munich (DE)

( * ) Notice: Subject to any disclaimer, the term of this patent is extended or adjusted under 35 U.S.C. 154(b) by 333 days.

(21) Appl. No.: 11/549,393

(22) Filed: Oct. 13, 2006

(65) Prior Publication Data

US 2008/0096311 A1  Apr. 24, 2008

(51) Int. Cl.
*H01L 23/48* (2006.01)
*H01L 21/44* (2006.01)

(52) U.S. Cl. .................. 257/688; 257/719; 257/723; 257/E23.078; 438/107; 438/117

(58) Field of Classification Search .................. 257/688, 257/700, 719, 723, 724; 438/106, 107, 117, 438/118, 119, 121, 125
See application file for complete search history.

(56) References Cited

U.S. PATENT DOCUMENTS 6,573,119 B1 *  6/2003  Hirashima et al. ............ 438/64
7,288,440 B2 * 10/2007  Kuratomi et al. ............ 438/126

\* cited by examiner

*Primary Examiner*—Hsien-ming Lee
(74) *Attorney, Agent, or Firm*—Coats & Bennett, P.L.L.C.

(57) ABSTRACT

An apparatus for connecting at least two components contains a lower die and an upper die. The lower die has the components which are to be connected, with the first component supporting the at least second component with an at least partial overlap relative to the first component. The lower die and the upper die can be moved relative to one another. The upper die carries at least two heatable plungers which are connected so as to be able to move relative to one another via a sealed pressure pad. The plungers and the pressure pad have a first flexible layer between them. A second flexible layer is arranged between the upper die and the lower die.

30 Claims, 4 Drawing Sheets

US 7,525,187 B2

APPARATUS AND METHOD FOR CONNECTING COMPONENTS

TECHNICAL FIELD

The present invention relates to an apparatus and a method for electrically and/or mechanically connecting at least two components having an upper die and a lower die which can move relative to one another.

BACKGROUND

Joints are used for assembling semiconductor devices in electronics. Joints can be produced as reliable and thermally stable metal connecting layers between at least two components in power semiconductor engineering, for example by applying the low temperature joining technique (LTJT).

Power semiconductor modules comprise a semiconductor package and at least two power semiconductor chips mounted on one or more substrates within the package. The power semiconductor chips usually comprise power electronic circuits such as rectifier bridges, DC-links, IGBT inverters, drivers, control units, sensing units, half bridge inverters, AC-DC converters, DC-AC converters, DC-DC converters, bidirectional hybrid switches, and more. Other components may be included. In case of a plurality of substrates, interconnections from one substrate to another are provided within the package. There is general need to provide more reliable joints between the substrate and the devices and components attached to it.

SUMMARY

An apparatus for electrically and/or mechanically connecting at least two components having an upper and a lower die is disclosed herein, in which the lower die contains the at least two components, with the first component supporting the at least second component with an at least partial overlap relative to the first component; the lower die and the upper die can be moved relative to one another; the upper die has at least two heatable plungers which are connected so as to be able to move relative to one another via a sealed pressure pad; the plungers and the pressure pad have a first flexible layer between them; and the upper die and the lower die have a second flexible layer arranged between them.

Further, a method for connecting at least two components using an upper and a lower die is disclosed, said method comprising the steps of: putting the at least two components into the lower die, with the first component supporting the at least second component with an at least partial overlap relative to the first component; wherein the upper die is designed with at least two heatable plungers which are connected so as to be able to move relative to one another via a sealed pressure pad; putting a first flexible layer between the plungers and the pressure pad; arranging a second flexible layer between the upper die and the lower die; and moving the lower die and the upper die relative to one another.

BRIEF DESCRIPTION OF THE FIGURES

The novel connection arrangement can be better understood with reference to the following drawings and description. The components in the figures are not necessarily to scale, instead emphasis is placed upon illustrating the principles of the novel arrangement. Moreover, in the figures, like reference numerals designate corresponding parts. In the drawings.

DETAILED DESCRIPTION

Figure 1:
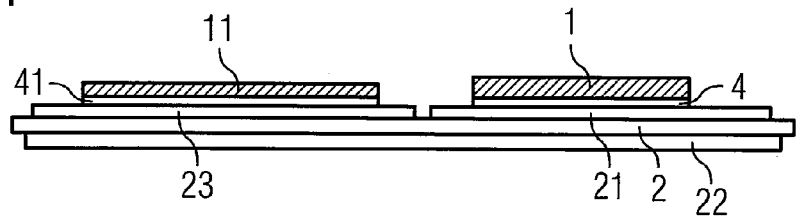
FIG. 1 is a cross sectional view of a connection arrangement of electronic devices with two power semiconductor devices and a substrate.

FIG. 1 shows a substrate 2 carrying the power semiconductor devices 1, 11. In one embodiment, substrate 2 may be a ceramic substrate, the material used may be HPS $Al_2O_3$, AlN or $Si_3N_4$. The substrate 2 can be provided with metallized layers 21, 23 on its side facing the semiconductor devices 1, 11. That side of the substrate 2 which is remote from the power semiconductor devices 1, 11 may have a further metallized layer 22 on it. As metallization materials for the layers 21, 22, 23 copper, aluminum or any other kind of commonly used metal may be used. In the embodiment of FIG. 1, layers 2, 21, 22, 23 form a Direct Copper Bonding (DCB) substrate, and the ceramic substrate has Cu layers 21, 22, 23 on it with layer thicknesses of between 0.1 and 1 mm. in other embodiments, other substrate types, such as Active Metal Brazing (AMB) substrates, Direct Aluminum bonding (DAB) substrates or regular brazing substrates may alternatively be used. The substrate 2 and the layers 21, 22, 23 may additionally be plated over the whole surface area or selectively, e.g. if the metallization is Al, Ni/Au—, Ni/Ag, Cu, Cu/Ni/Au, Cu/Ag, Ni/Pd, NiPdAg, Ti/Ni/Au, Ti/Ni/Ag, Cr/Ni/Au, Cr/Ni/Ag-plated. In case of Cu metallization, Au, Ag, Pd, Pt, W, Mo, Mn may be used for plating. Combinations of these materials are possible as well. The power semiconductor device 1 can be connected to the metal layer 21 of the substrate 2 by means of a connecting layer 4. The second semiconductor device 11 can be connected to the metallized layer 23 of the substrate 2 by means of a connecting layer 41. The semiconductor devices 1, 11 are also called chips in the following.

Figure 2:
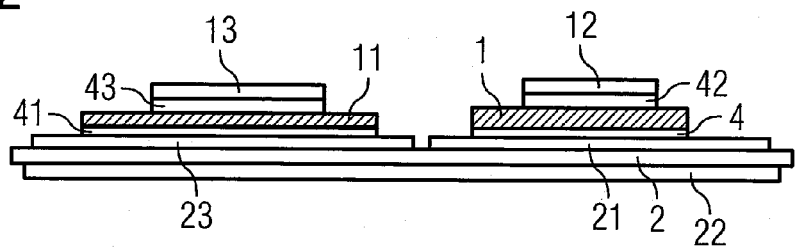
FIG. 2 is a cross sectional view of an arrangement of two power semiconductor devices which are situated on a substrate, with a respective additional contact having been put on each of the power semiconductor devices.

FIG. 2 shows an embodiment of the component arrangement from FIG. 1, with the chips 1, 11, respectively, having additional metal contacts 12, 13 on them. The metal contact 12 can be connected to the semiconductor device 1 by means of a connecting layer 42, the metal contact 13 being connected to the semiconductor device 11 by means of a connecting layer 43. In one embodiment, the layer thickness of the metal contacts 12, 13 may be 50 μm to 1 mm, with the metal contacts 12, 13 being situated exclusively on active surface areas of the semiconductor devices 1, 11, which serve as electrical contact regions.

Figure 3:
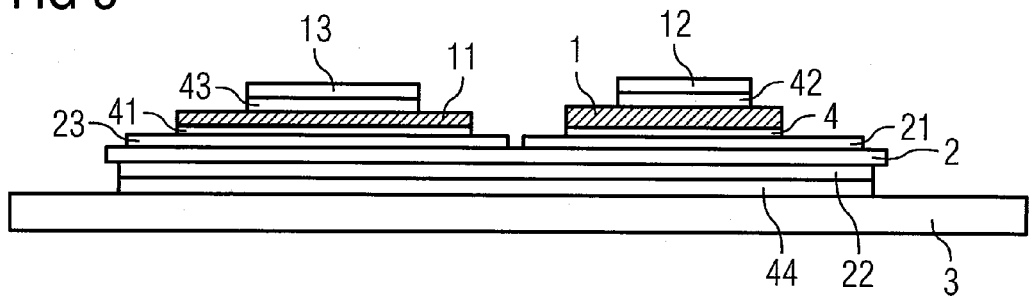
FIG. 3 is a cross sectional view of the arrangement of FIG. 2, where the substrate is additionally mounted on a planar base plate.

Another embodiment of components to be connected is shown in FIG. 3. The arrangement from FIG. 2 is situated on a planar base plate 3, the metallized layer 22 being connected to the planar base plate 3 by means of a connecting layer 44. The base plate 3 may be in untreated or nickel-plated form. Suitable materials for the base plate 3 are Cu, Al or metal matrix composite (MMC) materials. The MMC material may use copper, aluminum or aluminum alloy as a matrix. The matrix is filled by a filler material such as SiC powder, carbon graphite, carbon-nano-pipes, or pyroelectric-graphites, etc. or a mixture of any of these kinds. Known types of metal matrix composite are, for example, AlSiC, CuMo, CuW, CuSiC, and AlC. To produce a LTJT connection, a contact layer made of (in case of Al matrix) Ni/Au—Ni/Ag, Cu, Cu/Ni/Au, Cu/Ag, Ni/Pd, NiPdAg, Ti/Ni/Au, Ti/Ni/Ag, Cr/Ni/Au, Cr/Ni/Ag may be used. In the case of a Cu matrix Au, Ag, Pd, Pt, W, Mo, Mn or combinations of them may be put on the base plate 3. Alternatively, a contact layer on the base plate 3 may be dispensed with if a contact layer is activated in a subsequent method step. The substrate 2 has, for example, either the bare Cu, Au, Ag, Pd, Pt, W, Mo, Mn metallization or is, if the metallization is Al, Ni/Au—Ni/Ag, Cu, Cu/Ni/Au, Cu/Ag, Ni/Pd, NiPdAg, Ti/Ni/Au, Ti/Ni/Ag, Cr/Ni/Au, Cr/Ni/Ag-plated. Combinations of these kinds of materials are possible as well.

Figure 4:
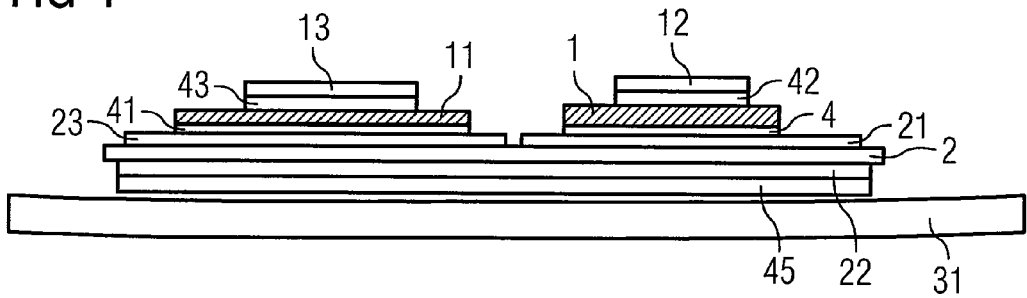
FIG. 4 is a cross sectional view of the arrangement of FIG. 3, where the base plate is arcuately shaped.

The embodiment in FIG. 4 is similar to that in FIG. 3, with the difference to FIG. 3 that the base plate 3 is arcuately shaped. The base plate 31 may be preshaped or bent during a process for connecting a plurality of components. Thermally stable and metal connecting layers 4, 41, 42, 43, 44, 45 are formed by means of a heat joining method. One of two components (1/21, 11/23, 12/1, 13/11, 22/3, 22/31) which are to be connected has a sinter material put on it before the joining process. The sinter material may be put on using a dispensing, sputtering, vapor deposition, printing or spraying process. The components prepared in this manner are then joined to one another with exact positioning for the joining process and are connected to one another by means of static pressure and a joining temperature. In this case, the sinter layer is converted into a connecting layer 4, 41, 42, 43, 44, 45 between the components 1, 2, 11, 12, 13, 21, 22, 23, 3 and 31, this layer producing a mechanically stable connection between the components. Producing a mechanically stable joint using a sinter layer is also called a sintering process.

The arcuately shaped base plate 31 can be shaped by deforming the planar base plate 3 before the sintering process or by a suitably shaped die as a base plate holder in the sintering process. In both cases, the force for deforming the arcuate base plate 31 can be introduced by means of plungers.

in one embodiment, to produce a mechanically stable connection using a sinter layer, high static pressure can be used. In the component arrangements in FIGS. 3 and 4, putting on a connecting layer up to the edge of the layers 21 and 23 therefore means that the outer edge of the layer 22 should be of the same length or larger than the outer edges of the layers 21 and 23. The outer edge of the connecting layer 44, 45 which has been put on should also not turn out to be larger than the outer edge of the layer 22, which is above it.

When producing joints, for example using LTJT technology, even introduction of a force over the whole surface of the components which are to be connected is of great importance for achieving a homogeneous connection for the components. Usually, pressure pads for introducing the necessary quasi hydrostatic pressure are used which are fitted between a plunger and the components which are to be connected. The pressure pads adjust themselves to the contours of the components which are to be connected. The pressure pads used may be made from fluorene polymers (Calres, Viton or silicone), for example.

in one embodiment, as a result of their deformability, the flexible and thermally stable pressure pads are able to compensate for small height differences in the components. However, the pressure pads alter their integrity in a repeat process cycle as a result of mechanical damage and therefore cannot guarantee reproducible initial conditions in productive use. The advantages of elastic pressure pads, such as the possibility of compensation for height differences between the components which are to be connected, are accordingly restricted by the fact that there is a lack of long-term stability for these plastic materials.

Particularly under the influence of the sharp-edged nature of components used, the tolerances of the components and the high contact pressures of up to 45 MPa, the shaping edges are permanently damaged in the course of the lifetime of a pressure pad. The result is increased wear of the pressure pad and an accompanying alteration in the joint parameters when large quantities are produced. A damage during a lifecycle also changes the creeping properties of the pad material. This increases the likelihood of the components moving relative to one another right at the start of the sintering process, which results in an increased number of faulty connections. In addition, contamination of the components on account of outgassing and bleeding from the pad materials is not completely avoidable. Particularly when processing chips and DCB-, AMB-, DAB- or regular brazing substrates, problems recurrently occur in the further processing which frequently can be eliminated only through additional cleaning processes. The pressure pads used immediately come into contact with the components which are to be heat treated at high process temperatures which arise, which means that the selection of the plastic materials which can be used is highly restricted.

In addition, mechanical systems for producing a mechanically stable joint with a sinter layer are used in which rams mounted so as to be able to move in an axis are used which serve as plungers. The rams are used for transmitting force via a liquid chamber which is sealed with a membrane. To be able to exert a hydrostatic pressure at high temperatures with a liquid, the use of oily liquids and metal membranes is required. The liquid chamber needs to be sealed by means of the metal membrane. This is possible only to a limited degree on the basis of today's level of knowledge and carries the risk of component contamination. The possible contact pressure with such systems is restricted, since the seal between the liquid chamber and the metal membrane must not be overloaded. Contact systems with liquid chambers are therefore suitable only for contact pressures of no more than 1 MPa.

For connection techniques with significantly higher contact pressures, such as the LTJT technique at approximately 45 MPa, a contact apparatus having a liquid chamber is unsuitable. Since only metals can be used as membrane materials at higher temperatures, and these have lower levels of flexibility than elastomer pressure pads, for example, these systems can be used to implement only plunger layouts with sufficiently large distances between the plungers. Plunger layouts with rams arranged close to one another cannot be implemented, since an even pressure distribution on the rams cannot be guaranteed on account of the low flexibility of the metal membrane. In addition, membranes produced from metals can compensate only for small height differences on account of their low flexibility in comparison with elastomer pressure pads.

Figure 5:
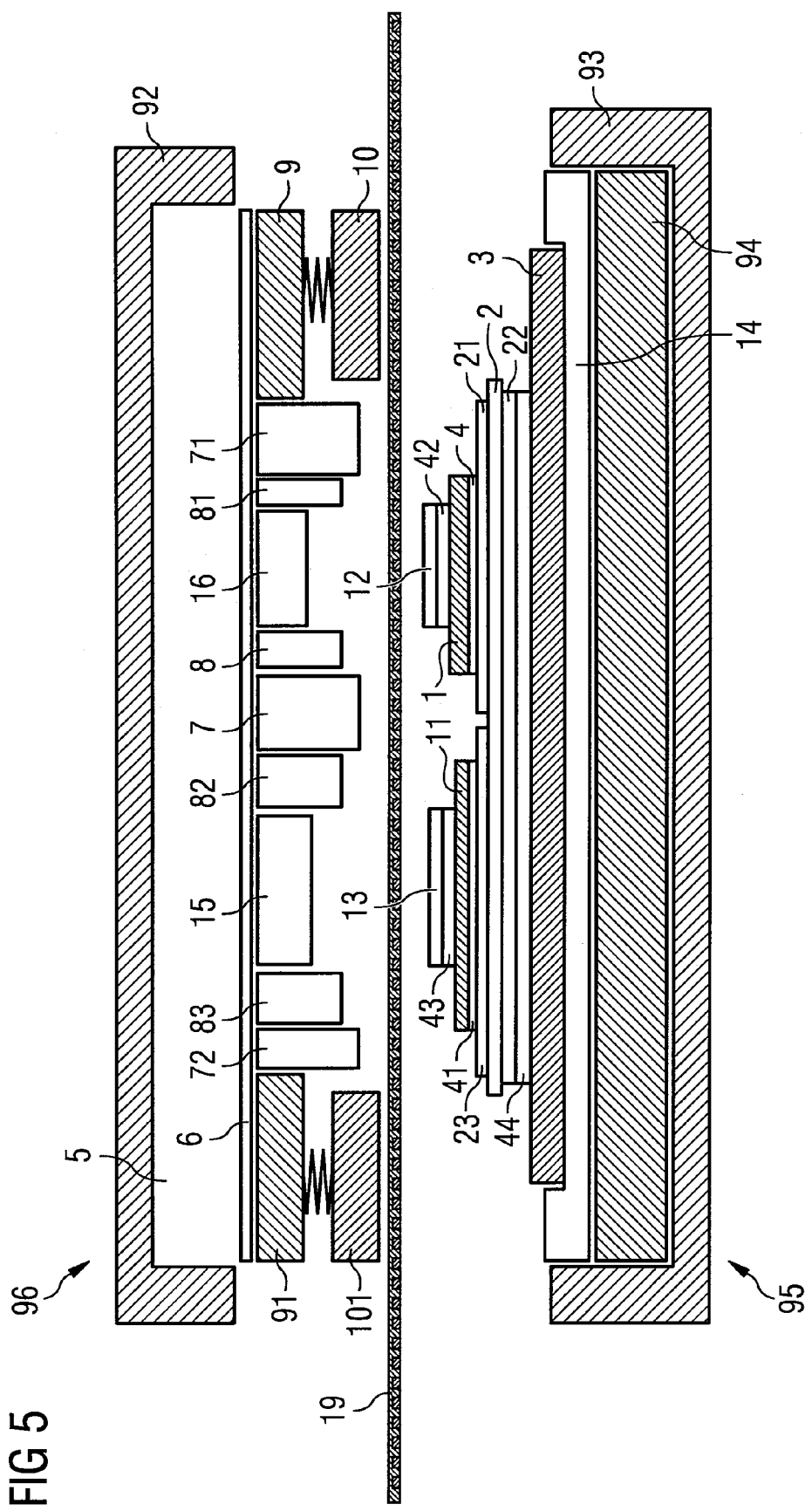
FIG. 5 is a cross sectional view of an example of a novel apparatus for connecting the components of the arrangement in FIG. 4 with the die open.

An embodiment of a novel connection arrangement is shown in FIG. 5 which is a cross sectional view of an open die. A lower die 95 contains an arrangement of components which are to be mounted, which, as described in FIG. 3, comprises electronic devices. A base plate 3 is placed with exact positioning into a heatable holder 14, the temperature of the holder 14 being able to change between 150 and 270° C., e.g. 250° C. The base plate 3 has the DCB substrate 2, 21, 22, 23 on it, on which the power semiconductor devices 1, 11 with added metal contacts 12 and 13 are arranged. Components 3, 2, 21, 22, 23, 1, 11, 12, 13 are intended to be connected to one another by means of sinter layers 4, 41, 42, 43, 44. To this end, the heatable holder 14 is positioned on a seat 94, which for its part is fitted in a lower die housing 93. The lower die 95 fitted with the components which are to be mounted can be moved against an upper die 96.

The upper die 96 comprises a pressure pad 5, which is arranged in a plane above pressure plungers 7, 8, 15, 16, 71, 72, 81, 82, 83 and is protected by a film 6 against penetration of the plungers. The pressure pad 5 may comprise fluorene polymers, polyurethane elastomers or silicone, wherein the polyurethane elastomer may be Eladur for example. The film 6 between the pressure pad 5 and the plungers 7, 8, 15, 16, 71, 72, 81, 82, 83 may likewise be made from polyurethane elastomers, such as Eladur.

As FIG. 5 shows, the length dimensions of the individual plungers are matched to the rated height dimensions of the arrangement of components which are to be mounted. The plungers 7 and 71 are used to apply pressure to the layer 21, with the plungers 7 together with the plungers 72 producing the pressure on the layer 23. The plungers 8, 81 apply pressure to the semiconductor device, with the plungers 82, 83 producing the pressure on the semiconductor device 11. The plungers 15, 16 apply the pressure to the contacts 12, 13 added to the devices 1, 11. The remaining height tolerances between the height topography of the arrangement of components 3, 2, 21, 22, 23, 1, 11, 12, 13 which are to be mounted and the plungers 7, 8, 15, 16, 71, 81, 82, 83 are covered by the flow properties of the pressure pad 5 and the film 6.

In this context, the hardness setting and the thickness of the film 6 can be chosen such that an even hydrostatic pressure is exerted on the individual plungers. Direct action of the pressure pad 5 on the components 1, 11, 12, 13, 21, 23 is avoided, which benefits the lifetime of the pressure pad 5. Contamination of the components 3, 2, 21, 22, 23, 1, 11, 12, 13 which are to be mounted through the use of the pressure pad material of the pressure pad 5 is minimized, since the pressure pad 5 is no longer in direct proximity to the components 3, 2, 21, 22, 23, 1, 11, 12, 13 which are to be mounted.

The upper die 96 has a plunger guide 9, 91 which is flanked by the externally arranged plungers 71, 72 of the plunger package 7, 8, 15, 16, 71, 72, 81, 82, 83. Arranged below the plunger guide 9, 91 are hold-down elements 10, 101 which are elastically connected to the plunger guides 9, 10 and, when the die 95, 96 is closed, press the compensation film 6 against the pressure pad. All the plungers are in heatable form. Besides arranging the plungers as a plunger package containing individual plungers, another arrangement comprises segmented plungers which, instead of a planar surface, have a surface with regions of different height, measured from the plunger holder on the film 6. The pressure of an individual plunger is homogeneously distributed over a flat surface of a component. Alternatively, a homogeneous pressure distribution is reached over flat surfaces of several components which are located in different heights by the use of segmented plungers. A combination of individual and segmented plungers may be chosen as well.

To protect the components 3, 2, 21, 22, 23, 1, 11, 12, 13 which are to be mounted against mechanical damage, they are covered by a compensation film 19 which is situated between the lower die 95 and the upper die 96. The hardness and thickness of this film can be chosen such that the surface topography of the arrangement comprising components which are to be mounted is compensated for completely. The compensation film 19 preferably comprises PTFE film.

Figure 6:
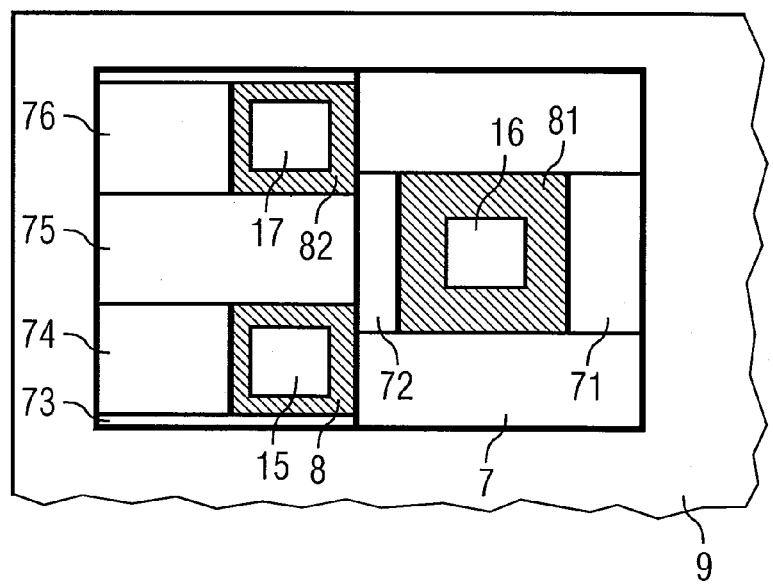
FIG. 6 is a plan view of the upper die's side facing the components which are to be mounted.

A plan view of the side of the upper die 96 which faces the components which are to be mounted can be seen in FIG. 6. The plungers 7, 8, 15, 16, 17, 71, 72, 73, 74, 75, 76, 81, 82 are surrounded by the plunger guide 9 and have their dimensions matched to the rated dimensions of the arrangement which is to be mounted.

Figure 7:
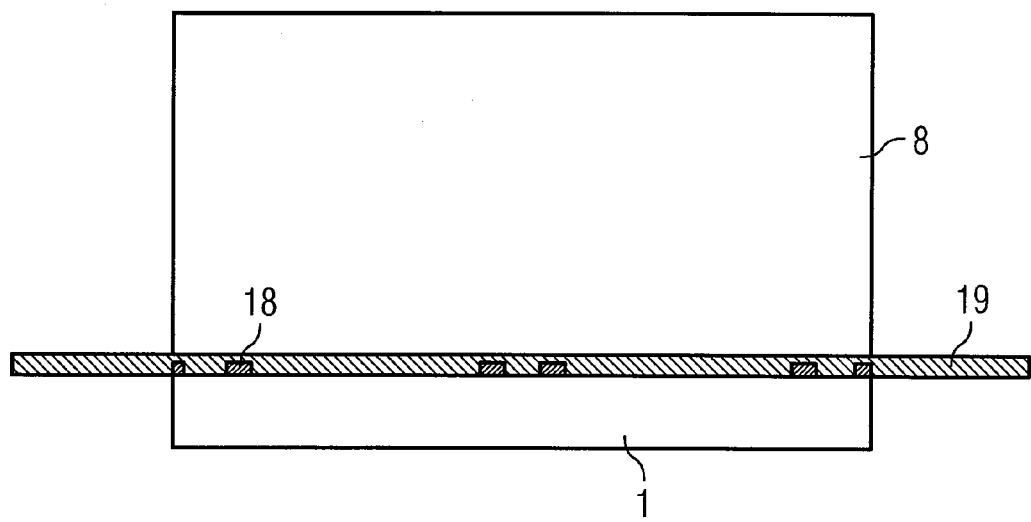
FIG. 7 is a cross sectional view of a closed die with parallel orientation of the plunger relative to a power semiconductor device in an example.

As an alternative to the arrangement having a planar base plate 3 as shown in FIG. 5, suitable shaping of the component holder 14 and of the plunger package allows an arbitrarily shaped design to be implemented for the components 3, 2, 21, 22, 23, 1, 11, 12, 13 which are to be mounted. In another alternative, the base plate 3 may be produced in convex form by means of concave shaping of the component holder 14 and with convex shaping of the plunger package. The requisite geometries in the component holder 14 and on the plunger package which result from the bending of the base plate 31 are achieved through pre-adjustment. Fine tuning can be done using the compensation film 19 and the hydrostatics of the pressure pad 5. A cross sectional view of another arrangement with the die closed is FIG. 7. The plunger 8 is on the semiconductor device 1, spaced apart by the film 19. The semiconductor device 1 has certain features, such as an imide coating 18, for example. The compensation film 19 lets the pressure from the plunger be homogeneously distributed over the semiconductor device 1.

Figure 8:
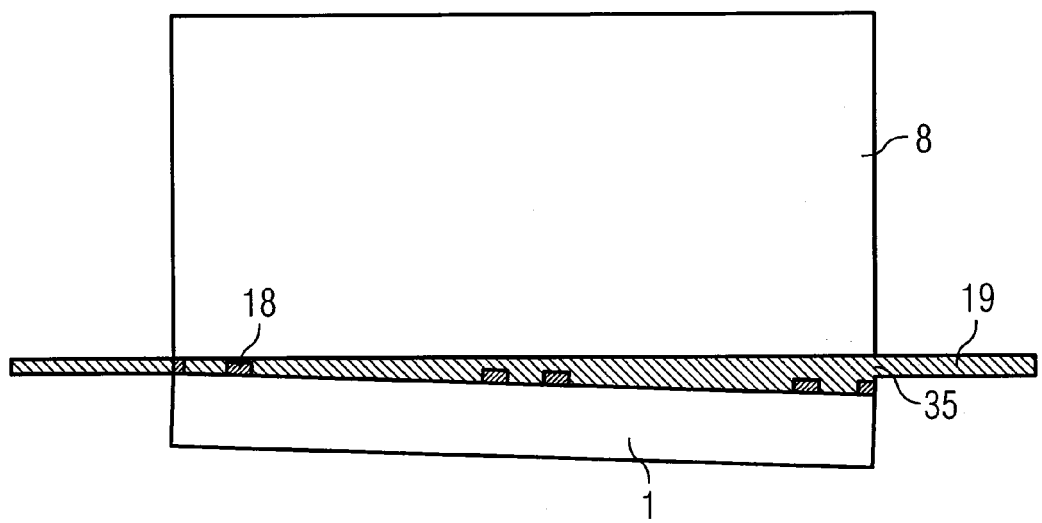
FIG. 8 is a cross sectional view of a closed die with the plunger in an oblique position relative to a power semiconductor device in another example.

The arrangement of FIG. 8 comprises a closed die and a bent base plate 3. Bending caused by the shaping of the component holder 14 at the location of the semiconductor device 1 can result in the power semiconductor device 1 being in an oblique position 35 relative to the plunger 8. It can be seen that the film 19 compensates for the possible oblique position 35 between the plunger 8 and the semiconductor device 1 by the virtue of the material of the film 19 flowing increasingly into the free spaces between the plungers 8 and the device 1 which are caused by the oblique position 35. Even when the shaping of the base plate 3 is not planar, an even pressure distribution on the semiconductor device 1 is assured by the pressure plunger 8.

Figure 9:
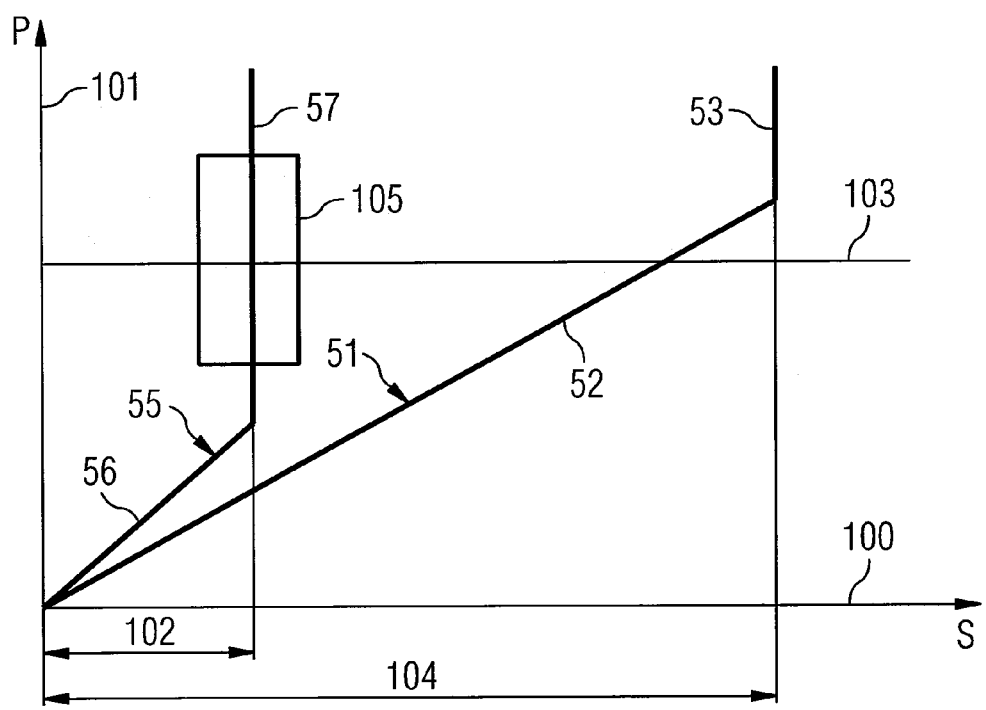
FIG. 9 is a schematic travel/pressure diagram for the pressure pad in yet another example of the connection arrangement with an illustration for two different pressure pad materials.

A schematic travel/pressure diagram for two materials 51, 55 for the pressure pad 5 is shown in FIG. 9. The horizontal line 103 stands for a hydrostatic pressure of approximately 30 MPa. This pressure should be achieved within a safe travel 102, 104 on a force/travel edge as steep as possible. The travels 102, 104 are obtained on account of cavities in the clamped pressure pad 5, height tolerances in the design of the upper die 96 and/or on account of plunger height tolerances, for example. A comparison between the materials silicone (53) and polyurethane (57) shows that the travel for building up the hydrostatic pressure 103 in the case of polyurethane 102 is just approximately ⅓ of the travel for silicone 104. The pressure corridor 105, which typically moves between 20 and 40 MPa, can, as FIG. 9 shows, be significantly shortened through the flexible use of materials for the pressure pad 5. Open-pored materials such as polyurethane elastomers, particularly Eladur, are appropriate for quickly reaching high pressures.

As an alternative to the arrangement of FIG. 9, the die may be of inverse design, i.e. with the pressure pad 5 and the plunger package in the lower die 95. This arrangement affords the advantage that the components to be connected can be stacked upon one another in the lower die using a positioning aid. In this way, the components which have not yet been connected to one another remain in position until the lower die 95 and the upper die 96 are closed. This advantage is achieved by virtue of the fact that the pressure pad is no longer arranged directly on the components which are to be connected but rather is moved to a different plane of the die. The pressure to produce the joint is introduced by means of pressure plungers.

The novel arrangements outlined above allow the use of pressures for applying low temperature joining techniques. Accordingly, altering joint parameters and contamination of the components which are to be connected are prevented.

In these arrangements, the pressure pad is moved to a plane of the die which is at such an interval from the components which are to be connected that the temperature which occurs there is lower than the temperature at the location of the components which are to be connected. The introduction of force into the components which are to be connected is adopted by metal or ceramic plungers between the components and the pressure pad. Alternatively, segmented plungers with different heights on the plunger surface may be used in order to cover larger component surface areas.

One advantage is the protection of the pressure pad against possible mechanical damage. This can be done by introducing a film between the pressure pad and the plungers. The layer thickness and hardness of this film are such that it firstly ensures an even pressure distribution over the available plungers and secondly protects the elastic pressure pad against damage. Constant joint parameters during the joining process are achieved in this way.

In addition, these arrangements allow the simultaneous connection of the semiconductor devices 1, 11 to a substrate 2 via the layers 21, 23 and to a base plate 3, 31 via the layer 22 to be complemented in the same process step by the connection of further components 12, 13 to one another in additional layers 42, 43. In this case, additional metal contacts 12, 13 are particularly appropriate, whose small surface area and sharp-edged nature have previously meant that they could be connected to the semiconductor devices 1, 11 only in a separate process.

Another advantageous aspect is that heat sensitive materials can also be employed for use as pressure pads, since the pressure pad does not come into direct contact with the components which are to be heat treated.

A further improvement in the process stability when mounting the components is obtained as a result of a second film which is introduced between the plungers and the components which are to be mounted. The compensating property of the second film means that the plungers can no longer cause mechanical damage to the components which are to be mounted. The plungers are therefore spaced apart both from the pressure pad which is protected by a first film and from the components which are to be mounted as a result of the second film. The hardness and thickness of the second film is chosen such that the surface topography of the components can be compensated for completely.

What is claimed is:

1. An apparatus for connecting at least two components; said apparatus comprising an upper die and a lower die, wherein the lower die comprises the at least two components, with a first component supporting an at least second component with an at least partial overlap relative to the first component;

the lower die and the upper die are movable relative to one another;

the upper die comprises at least two heatable plungers which are connected so as to be able to move relative to one another via a sealed pressure pad;

a first flexible layer is arranged between the at least two heatable plungers and the sealed pressure pad; and a second flexible layer is arranged between the upper die and the lower die.

2. The apparatus of claim 1, wherein one of the at least two components to be connected is a base plate, a substrate, a semiconductor device or an additional contact.

3. The apparatus of claim 2, wherein the base plate is of planar design, is preshaped or is bent.

4. The apparatus of claim 2, wherein the substrate is a Direct Copper Bonding (DCB) substrate, an Active Metal Brazing (AMB) substrate, a Direct Aluminum bonding (DAB) substrate or a regular brazing type substrate.

5. The apparatus of claim 2, wherein the semiconductor device is a power semiconductor device.

6. The apparatus of claim 2, wherein the additional contact is a metal contact.

7. The apparatus of claim 2, wherein the additional contact is plate shaped.

8. The apparatus of claim 2, wherein the additional contact is made of Cu.

9. The apparatus of claim 1, wherein the at least two components are connected by a sinter layer.

10. The apparatus of claim 9, wherein the sinter layer is made by a low temperature joining technique.

11. The apparatus of claim 1, wherein each of the at least two heatable plungers has a surface which is planar relative to a component which is to be connected or a surface which is divided into different heights.

12. The apparatus of claim 1, wherein the sealed pressure pad and the first and second flexible layers comprise elastic plastic.

13. The apparatus of claim 1, wherein the sealed pressure pad comprises fluorene polymers, polyurethane elastomers, and/or silicone.

14. The apparatus as claimed in claim 1, wherein the first flexible layer comprises polyurethane elastomers.

15. The apparatus of claim 1, wherein the sealed pressure pad and/or first flexible layer comprise a polyurethane elastomer.

16. The apparatus of claim 1, wherein the second flexible layer comprises PTFE (Teflon).

17. The apparatus of claim 1, wherein a pressure exerted on the at least two components is between 20 and 40 MPa.

18. The apparatus of claim 1, wherein the at least two components are situated on a holder; said holder being heatable.

19. The apparatus of claim 1, wherein a temperature difference between the at least two components is between 150 and 270 degrees Celsius.

20. The apparatus of claim 1, wherein the upper die is arranged below the lower die.

21. A method for connecting at least two components using an upper and a lower die, comprising the steps of:

putting the at least two components into the lower die, with a first component supporting an at least second component with an at least partial overlap relative to the first component; wherein the upper die is designed with at least two heatable plungers which are connected so as to be able to move relative to one another via a sealed pressure pad;

putting a first flexible layer between the at least two heatable plungers and the sealed pressure pad;

arranging a second flexible layer between the upper die and the lower die; and moving the lower die and the upper die relative to one another.

22. The method of claim 21, wherein one of the at least two components is a base plate and in the step of moving the lower die and the upper die relative to one another a planar or preshaped shape of the base plate is left unaltered.

23. The method of claim 21, wherein one of the at least two components is a base plate and in the step of moving the lower die and the upper die relative to one another the base plate is bent.

24. The method of claim 21, further comprising a step of applying a sinter material between the at least two components.

25. The method of claim 24, wherein the step of applying a sinter material between the at least two components includes a low temperature joining technique.

26. The method of claim 21, wherein the step of moving the lower die and the upper die relative to one another includes that a pressure of each of the at least two heatable plungers is homogeneously distributed over a flat surface of one of the at least two components or over flat surfaces of the at least two components which are located in different heights.

27. The method of claim 21, wherein the step of moving the lower die and the upper die relative to one another includes applying a pressure on the at least two components between 20 and 40 MPa.

28. The method of claim 21, further comprising a step of heating the at least two components by a holder on which said at least two components are situated.

29. The method of claim 21, further comprising a step of generating a temperature difference between the at least two components ranging between 150 to 270 degrees Celsius.

30. The method of claim 21, wherein the step of moving the lower die and the upper die relative to one another includes that the sealed pressure pad and the at least two heatable plungers are used as a positioning aid in the lower die for the at least two components to be connected.

* * * * *